United States Patent [19]

Kamon

[11] Patent Number: 5,285,258
[45] Date of Patent: Feb. 8, 1994

[54] METHOD OF AND AN APPARATUS FOR DETECTING ALIGNMENT MARKS

[75] Inventor: Kazuya Kamon, Itami, Japan

[73] Assignee: Mitsubishi Denki Kabushiki Kaisha, Tokyo, Japan

[21] Appl. No.: 960,846

[22] Filed: Oct. 14, 1992

[30] Foreign Application Priority Data

Apr. 9, 1992 [JP] Japan .................................. 4-088473

[51] Int. Cl.⁵ .............................................. G01B 11/00
[52] U.S. Cl. .................................... 356/375; 356/364; 356/401
[58] Field of Search ................ 356/369, 375, 399–401, 356/364; 250/548, 237 G

[56] References Cited

U.S. PATENT DOCUMENTS 4,938,598  7/1990  Akiyama et al. .................... 356/401

Primary Examiner—F. L. Evans
Attorney, Agent, or Firm—Oblon, Spivak, McClelland, Maier & Neustadt

[57] ABSTRACT

A semiconductor wafer, which has a diffractive grating array acting as a alignment mark, is irradiated with a polarized light beam while relatively moving the semiconductor wafer and the polarized light beam. The polarized light beam consists of a polarized component which vibrates in a direction substantially perpendicular to the diffractive grating array. A diffractive light beam from the wafer is received to measure the light intensity thereof. On the basis of the measured intensity, the diffractive grating array is detected. Thus, it is possible to accurately detect the alignment mark.

11 Claims, 14 Drawing Sheets

METHOD OF AND AN APPARATUS FOR DETECTING ALIGNMENT MARKS

BACKGROUND OF THE INVENTION

1. Field of the Invention

The present invention relates to a method of and an apparatus for detecting alignment marks which are used in measuring a reference position to which a mask pattern and a semiconductor wafer pattern are aligned during exposure.

2. Description of the Background Art

In an exposure apparatus which is used to obtain a resist pattern, to have an excellent mask-wafer alignment accuracy is as important as to have an excellent resolution. Briefly speaking, "alignment" as termed in the semiconductor industry refers to aligning a mask pattern to a previously formed wafer pattern. In actual procedures, "alignment" involves detecting the alignment marks, and aligning mask marks to the alignment marks which are previously formed on a semiconductor wafer at predetermined positions.

FIG. 1 shows an example of alignment marks. In FIG. 1, alignment marks are diffraction gratings 6 which are formed on scribe lines 2 scribed on a semiconductor wafer 1. Lines of the diffraction gratings 6 extending in a direction X are a diffraction grating array 3Y, hereinafter referred to as "a Y-mark." The Y-mark is used to detect the position of an alignment mark which extends in a direction Y (described later). Lining in the direction X, the diffraction gratings 6 form a diffraction grating array 3X which is used in detecting the position of an alignment mark which elongates in the direction X. The diffraction grating array 3X will be hereinafter referred to as "an X-mark."

FIGS. 2A and 2B are explanatory diagrams for explaining a conventional alignment method. A first step of the conventional alignment method is to split a laser beam into two laser beams, one for illuminating an X-mark and the other for illuminating a Y-mark. The illumination laser beams 4 thus produced are illuminated onto the semiconductor wafer 1 at preselected laser beam illumination positions through a projection optical system. As shown in FIG. 2B, the laser beam 4 for illuminating the Y-mark irradiates the semiconductor wafer 1 in the shape of a strip which extends in the direction X. The laser beam 4 for illuminating the X-mark, on the other hand, falls on the semiconductor wafer 1 in the shape of a strip extending in the direction Y (not shown). The semiconductor wafer 1 is moved in the direction Y to scan the Y-mark illumination laser beam 4 on the semiconductor wafer 1 (FIG. 2B), during which the signal intensity of a diffractive light beam from the semiconductor wafer 1 is successively measured. The signal intensity of the diffraction light beam varies a the semiconductor wafer 1 slides. More precisely, when a Y-mark 3Y comes to the laser beam illumination position, a diffraction light beam is produced by the diffraction gratings 6 of the Y-mark 3Y, thereby largely changing the signal intensity under measurement. Hence, a Y-coordinate of the Y-mark 3Y is detected by measuring a change in the signal intensity of the diffraction light beam. An X-coordinate of an X-mark 3X is detected in a similar manner: The semiconductor wafer 1 is moved in the direction X to scan the X-mark illumination laser beam 4 on the semiconductor wafer 1 and the signal intensity measurement is carried out during the scanning. Thus, it is possible to detect the X- and the Y-direction alignment marks of the semiconductor wafer 1.

However, theory and reality do not always agree. In an actual structure of the semiconductor wafer the diffraction gratings 6 forming the X- and the Y-marks 3X and 3Y do not have ideal configurations as those shown in FIG. 2A due to the existence of an overlying element such as a metal film 5 as shown in FIG. 3. Metal particles deposited arrisways the surface of the semiconductor wafer 1 are especially problematic because such deposition causes the diffractive gratings 6 of the X- and the Y-marks 3X and 3Y to have asymmetric configurations. This makes it impossible to produce desirable diffraction light beams. Since desired diffraction light beams are not obtainable, chances are that the alignment marks of the semiconductor wafer 1 cannot be accurately detected.

If the diffractive gratings 6 each have an ideal configuration as shown in FIG. 4, the intensity of a diffraction light beam becomes strongest (intensity peak P) when the diffractive gratings b are located at the laser beam illumination position. Hence, it is possible to detect the positions of the diffractive gratings 6 by finding where the intensity peaks P are observed. The opposite case is illustrated in FIG. 5. In FIG. 5, the diffractive grating 6 has an asymmetrical shape due to a metal film 7 deposited thereon. Due to the asymmetrical shape of the diffractive grating 6, the intensity of a diffraction light beam grows extremely strong for more than once, exactly three times in the example of FIG. 5 (intensity peaks P1 to P3), in the vicinity of the diffractive grating 6. As a result, it becomes very difficult to detect the precise position of the diffractive grating 6.

Thus, in the conventional alignment method, a film formed on the semiconductor wafer 1 deteriorates a detection accuracy of detecting the X- and the Y-marks 3X and 3Y (i.e., diffraction grating arrays) which function as alignment marks.

SUMMARY OF THE INVENTION

The present invention is directed to a method of detecting an alignment mark of a semiconductor wafer by measuring the light intensity of a diffractive light beam from a diffractive grating array which is formed on the semiconductor wafer and which extends in a first direction. According to the present invention, the method comprises the steps of: (a) irradiating the semiconductor wafer with a polarized light beam while relatively moving the semiconductor wafer and the polarized light beam, the polarized light beam consisting of a polarized component which vibrates in a second direction substantially perpendicular to the first direction; (b) receiving a diffractive light beam from the semiconductor wafer; and (c) detecting the diffractive grating array on the basis of the light intensity of the received diffractive light beam.

Preferably, the polarized light beam acts on the diffractive grating array as a P-polarized light beam.

In an aspect of the present invention, the method comprises: (a) irradiating the semiconductor wafer with a non-polarized light beam while relatively moving the semiconductor wafer and the non-polarized light beam, the non polarized light beam vibrating in planes at random angles; (b) polarizing a diffractive light beam from the semiconductor wafer, thereby obtaining a polarized light beam, the polarized light beam consisting of a polarized component which vibrates in a second direction substantially perpendicular to the first direction; (c) receiving the polarized light beam; and (d) detecting the diffractive grating array on the basis of the light intensity of the received polarized light beam.

Preferably, the polarized light beam acts on the diffractive grating array as a P-polarized light beam.

The present invention is also directed to apparatus for detecting an alignment mark of a semiconductor wafer by measuring the light intensity of a light beam from a diffractive grating array which is formed on the semiconductor wafer and which extends in a first direction. According to the present invention, the apparatus comprises: (a) means for obtaining a polarized light beam, the polarized light beam having a polarized component which vibrates in a second direction substantially perpendicular to the first direction; (b) a stage for holding the semiconductor wafer; (c) means for directing the polarized light beam to the semiconductor wafer mounted on the stage; (d) light receiving means for receiving a diffractive light beam from the semiconductor wafer; and (e) means for relatively moving the semiconductor wafer and the polarized light beam while detecting the diffractive grating array on the basis of the light intensity of the diffractive light beam received by the light receiving means.

In an aspect of the present invention, the apparatus comprises: (a) a light source for emitting a non-polarized light beam, the non-polarized light beam vibrating in planes at random angles; (b) a stage for holding the semiconductor wafer; (c) means for directing the non-polarized light beam to the semiconductor wafer mounted on the stage; (d) a polarizer for polarizing a diffractive light beam from the semiconductor wafer, thereby obtaining a polarized light beam, the polarized light beam consisting of a polarized component which vibrates in a second direction substantially perpendicular to the first direction; (e) light receiving means for receiving the polarized light beam passing through the polarizer; and (f) means for relatively moving the semiconductor wafer and the polarized light beam while detecting the diffractive grating array on the basis of the light intensity of the polarized light beam received by the light receiving means.

Accordingly, an object of the present invention is to offer a method of and an apparatus in which alignment marks are accurately detected despite the existence of a film formed on a semiconductor wafer.

These and other objects, features, aspects and advantages of the present invention will become more apparent from the following detailed description of the present invention when taken in conjunction with the accompanying drawings.

DESCRIPTION OF THE PREFERRED EMBODIMENTS

A. Principles of the Invention

Figure 6A:
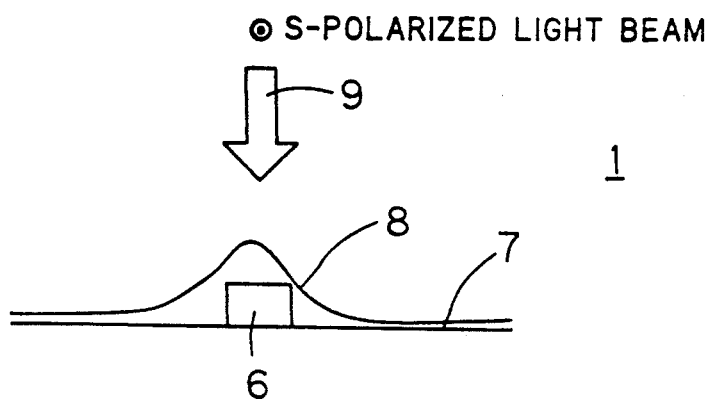
FIGS. 6A, 6B, 7A and 7B are explanatory diagrams for explaining the principles of a method of detecting alignment marks according to the present invention.
Figure 6B:
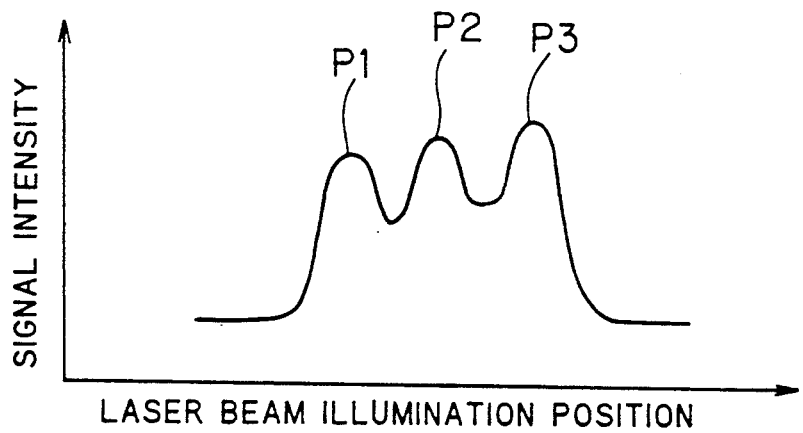
Figure 7A:
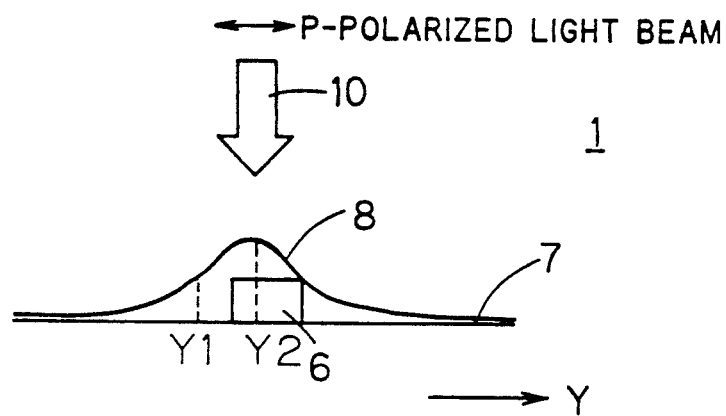

FIGS. 6A, 6B, 7A, 7B and 8 are diagrams for explaining the principles of an alignment mark detection method according to the present invention. In FIG. 6A, a metal film 7 is deposited on a diffraction grating 6, whereby the metal film 7 forms a slope 8. A semiconductor wafer 1 is irradiated with a laser beam 9 which acts on the slope 8 as an S-polarized light beam (i.e., a light beam which vibrates only in a plane perpendicular to the drawing sheet of FIG. 6A). At the semiconductor wafer thus illuminated, three intensity peaks of a diffraction light beam P1 to P3 occur in the vicinity of the diffractive grating 6, as shown in FIG. 6B. In FIG. 7A, the illumination light beam onto the semiconductor wafer 1 is a laser beam 10 which acts on the slope 8 as a P-polarized light beam (i.e., a light beam which vibrates only in a plane parallel to and sidewise the drawing sheet of FIG. 7A). In this case, the signal intensity of a resultant diffraction light beam shows a sharp increase only once at a position Y2 which corresponds to the location of the diffraction grating 6, resulting in formation of the intensity peak P. It therefore follows that a laser beam consisting of P-polarized components is less reflected at the slope 8.

Reflectance RP and RS with respect to the P- and S-polarized light beams and incident angles of the P- and the S-polarized light beams are in the following relations:

$$RP = \tan^2(\theta i - \theta t)/\tan^2(\theta i + \theta t) \quad (1)$$

$$RS = \sin^2(\theta i - \theta t)/\sin^2(\theta i + \theta t) \quad (2)$$

where $\theta i$ and $\theta t$ are an incident angle and a refraction angle, respectively. Plotted against the incident angle, the reflectance RP and RS obtainable from Eqs. 1 and 2 follow the curves shown in the graph of FIG. 8. The incident angle $\theta i$ is measured along the lateral axis of the graph and the reflectance are measured along a vertical axis of the graph. The solid curve indicates the reflectance/incident-angle relation of the p-polarized light beam while the dotted curve indicates that of the S-polarized light beam. As the curves show, the reflectance RP of the P-polarized light beam is smaller than the reflectance RS of the S polarized light beam at the slope 8 of the semiconductor wafer 1 ($0° < \theta i < 90°$). Thus, the graph also leads to the same conclusion that the P-polarized light beam is less reflected at the slope 8 than the S-polarized light beam.

Figure 9A:
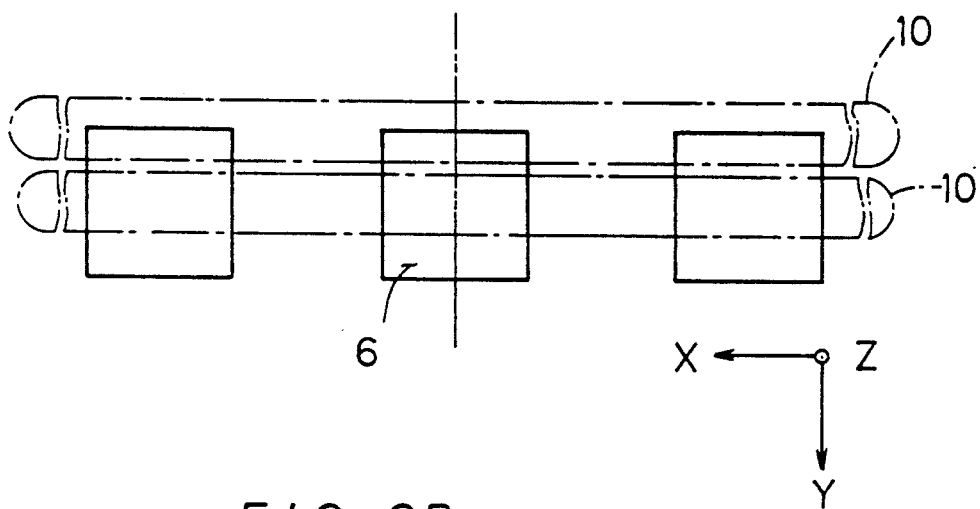
FIGS. 9A and 9B are explanatory diagrams for explaining the principles of the method of detecting alignment marks according to the present invention.
Figure 9B:
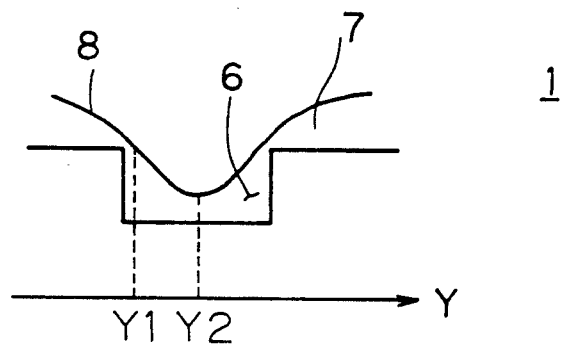

In light of the conclusion above, description will be given next, while referring to FIG. 9A and 9B, on the signal intensity of a diffraction light beam which is created from illumination of the Y-mark 3Y by the laser beam 10 which consists of polarized components vibrating in the Y-direction plane. FIG. 9A corresponds to FIG. 2B, and FIG. 9B is a cross sectional view taken along the double dot line of FIG. 9A.

Figure 7B:
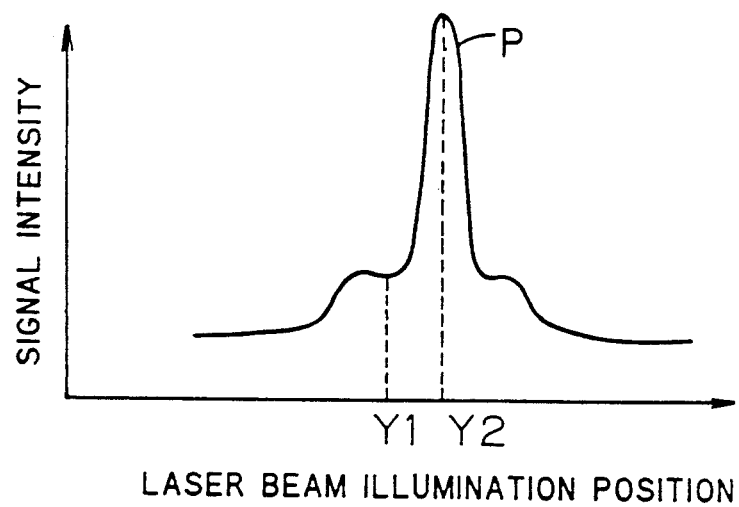
Figure 8:
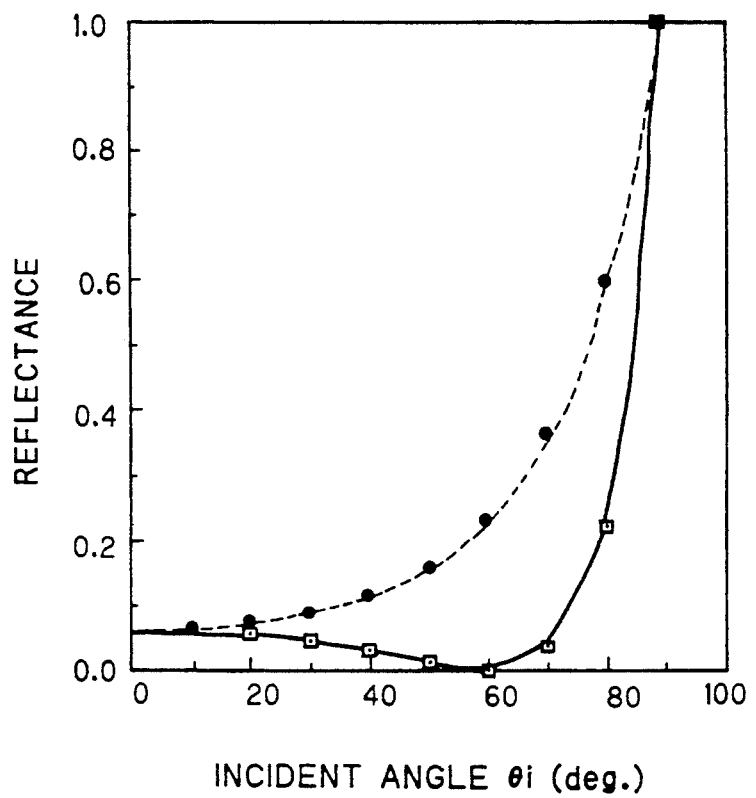
FIG. 8 is a graph plotting reflectance of a P-polarized and an S-polarized light beams against an angle of incident.

The laser beam as herein used consists of polarized components which vibrate in a plane perpendicular to an elongating direction of the diffraction gratings 6 forming the Y-mark 3Y, i.e., in the Y-direction plane. The semiconductor wafer 1 is moved in the direction Y while being illuminated at a predetermined position with the laser beam 10 so that the laser beam 10 sweeps on the semiconductor wafer in the direction Y. As the laser beam 10 approaches the slope 8, the laser beam 10, consisting of the polarized components of the nature described above, begins to act as a P-polarized light beam on the slope 8. At a middle of the slope 8, e.g., at a Y-coordinate Y1 of FIG. 9B, the laser beam 10 impinges on the slope 8 at an angle as large as 60 degrees. As is evidenced in FIG. 8, the reflectance at the slope 8 is relatively small when the incident angle is such large, and therefore, as shown in FIG. 7B, the signal intensity of a resultant diffraction light beam is weak. As the laser beam 10 further scans in the direction Y and arrives at a top of the slope 8 (e.g., an Y-coordinate Y2 of FIG. 9B), the indecent angle of the laser beam 10 to the slope 8 decreases as small as zero degree, thereby the reflectance at the slope 8 growing relatively large. With the increase in the reflectance, the signal intensity of a diffraction light beam surges to form the intensity peak P (FIG. 7B).

Thus, in detection of an alignment mark using the laser beam 10 which consists of polarized components which vibrate in the plane perpendicular to the diffraction gratings 6 forming the Y-mark 3Y, the signal intensity of the diffraction light beam is suppressed low at a position away from the diffraction gratings 6, for example, at the Y-coordinate Y1. Since the signal intensity of the diffraction light beam at the Y-coordinate Y1 follows nearly ideal waveform, where the intensity peak is reached (i.e., Y-coordinate Y2) is correctly found. Hence, it is possible to accurately detect a coordinate of the Y-mark 3Y (i.e., Y-coordinate Y2) which serves as an alignment mark.

B. Preferred Embodiments of Alignment Mark Detection Apparatus

Figure 10:
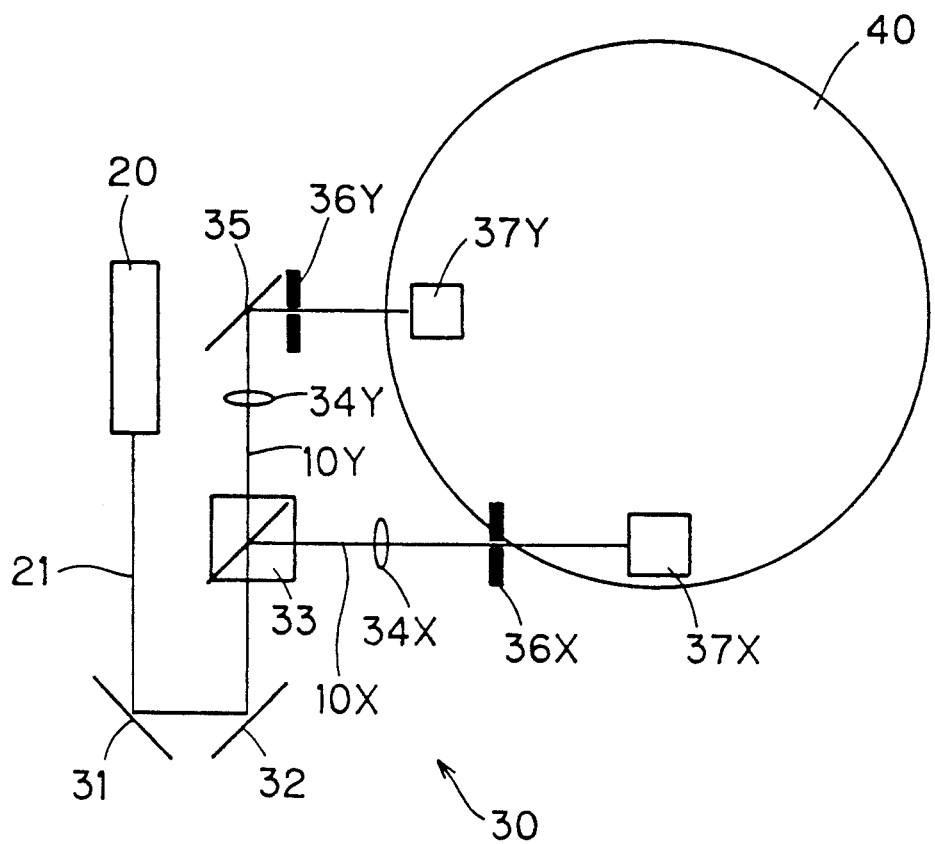
FIGS. 10 and 11 are schematic diagrams showing one embodiment of an apparatus for detecting alignment marks to which the detection method of the present invention is applicable.
Figure 11:
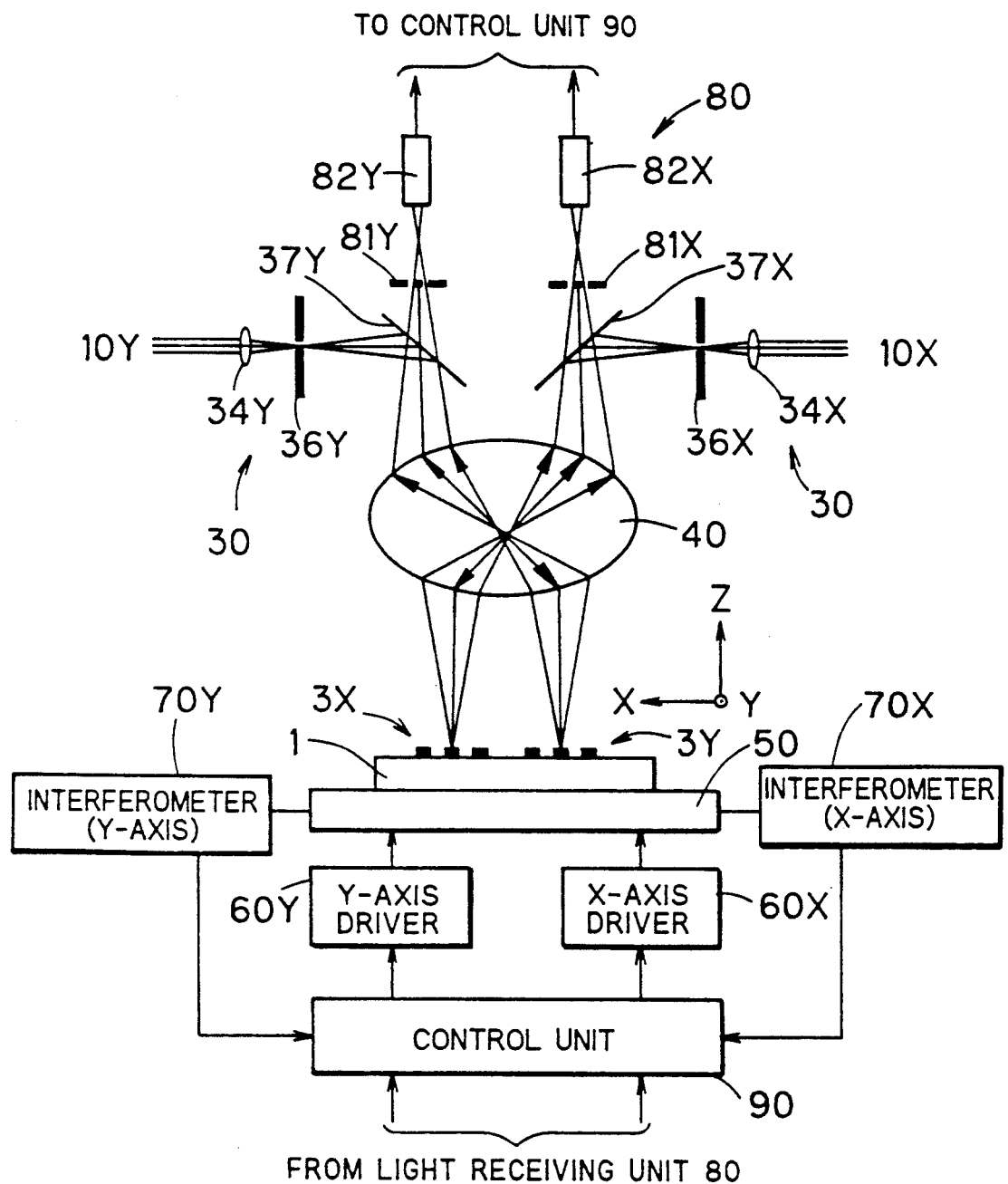

FIGS. 10 and 11 are schematic diagrams showing the structure of an apparatus for detecting alignment marks to which the alignment mark detection method of the present invention is applicable. The apparatus for detecting alignment marks (hereinafter referred to simply as "detection apparatus") comprises an He-Ne laser 20 for emitting a laser beam 21. The laser beam 21 enters a polarization unit 30 where it is split into two polarized laser beams 10X and 10Y which impinge on a projection lens 40. More particularly, the polarization unit 30 includes two mirrors 31 and 32 which are disposed at appropriate positions so as to relay the laser beam 21 to a polarization beam splitter 33. Strictly speaking, therefore, it is the polarization beam splitter 33 that splits the laser beam 21 into the two polarized laser beams 10X and 10Y. The laser beam 10X enters a beam shaper plate 36X through a lens 34X. From the beam shaper plate 36X, the laser beam 10X advances to a half mirror 37X through which it is eventually received by the projection lens 40. Travelling a similar route, the laser beam 10Y enters the projection lens 40 through a lens 34Y, a mirror 35, a beam shaper plate 36Y and a half mirror 37Y.

Generated at the polarization beam splitter 33, the laser beams 10X and 10Y are polarized beam which have planes of vibration which cross at a right angle to each other. The laser beams 10X and 10Y are used to detect X- and the Y-marks 3X and 3Y, respectively. To attain desired detection, elements forming the polarization unit 30 such as the polarization beam splitter 33 are located so as to satisfy the following conditions. One of the conditions concerns the polarized laser beam 10Y. The polarized laser beam 10Y to be illuminated onto the Y-mark 3Y formed on the semiconductor wafer 1 (described later) needs to have a plane of vibration which extends in a direction perpendicular to the array of the diffraction gratings 6 forming the Y-mark 3Y (i.e., in the direction Y). That is, the polarized laser beam 10Y must act on the slope 8 (FIG. 7A) of the Y-mark 3Y as a P-polarized light beam. The other condition relates to the polarized laser beam 10X. The polarized laser beam 10X is required to have a plane of vibration which extends in a direction perpendicular to the array of the diffraction gratings 6 forming the X-mark 3X (i.e., in the direction X). These conditions must be satisfied in mounting the polarization beam splitter 33 and the other elements in the polarization unit 30.

The polarized laser beams 10X and 10Y entering the projection optical system 40 are irradiated onto the semiconductor wafer 1 which is mounted on an X-Y stage 50 (FIG. 11). Connected with an X-axis driver 60X and a Y-axis driver 60Y, the X-Y stage 50 is capable of moving in the directions X and Y. By moving the X-Y stage 50 with the semiconductor wafer 1 mounted thereon under the control of the X-axis driver 60X and the Y-axis driver 60Y, the semiconductor wafer 1 is moved in the direction X or Y, thereby scanning the polarized laser beams 10X and 10Y on the semiconductor wafer 1 in the direction X or Y.

The detection apparatus is also equipped with optical interferometers 70X and 70Y which are disposed near the X-Y stage 50. Precise detection of an X-coordinate and a Y coordinate of the X-Y stage 50 is attained by the optical interferometers 70X and 70Y.

The two laser beams are bounced off by the semiconductor wafer 1 returns to the projection optical system 40 from which they travel to a light receiving unit 80 through the half mirrors 37X and 37Y. The light receiving unit 80, including a space filter 81X and a light receiving sensor 82X, detects the signal intensity of the diffraction light beam which is created where the laser beam 10X is being irradiated (one of the laser beam illuminating positions). The light receiving unit 80 further includes a space filter 81Y and a light receiving sensor 82Y. With the space filter 81Y and the light receiving sensor 82Y, the light receiving unit 80 also detects the signal intensity of the diffraction light beam which is created at a position where the laser beam 10Y is being irradiated (the other of the laser beam illuminating positions).

A control unit 90 is electrically connected with the X-axis and the Y-axis drivers 60X and 60Y, the optical interferometers 70X and 70Y, and the light receiving sensors 82X and 82Y. This is the general structure of the detection apparatus.

Next, the detection apparatus will be described as to its operation. First, the laser beam 21 is emitted from the He-Ne laser 20. The laser beam 21 is split into the two polarized laser beams 10X and 10Y by the polarization beam splitter 33. The polarized laser beams 10X and 10Y thus produced are then illuminated onto the semiconductor wafer 1 at the laser beam illumination positions through the projection optical system 40.

The X-Y stage 50 is moved in the direction Y, thereby sliding the semiconductor wafer 1 in the direction Y. Thus, the laser beam 10Y is scanned on the semiconductor wafer 1 in the direction Y. Simultaneous with the scanning of the laser beam 10Y, the light receiving sensor 82Y continuously measures the signal intensity of the diffraction light beam from the semiconductor wafer 1. As described earlier in relation to the principles of the invention, a waveform the measured signal intensity follows becomes something like the waveform as shown in FIG. 7B. The waveform of the signal intensity obtainable in this embodiment is rather ideal since the laser beam 10Y acts as a P-polarized light beam on the slope 8 of the Y-mark 3Y (FIG. 7A). Hence, it is possible to accurately find where the signal intensity regarding the Y-mark 3Y reaches its peak. The reason of this has already been explained, and therefore, will not be repeated here.

In accordance with a signal from the optical interferometer 70Y, the control unit 90 stores in a memory thereof (not shown) a Y-coordinate of the X-Y stage 50 of when the intensity peak was reached as the position of the Y-mark 3Y.

In a similar manner, the laser beam 10X is scanned on the semiconductor wafer 1 during which the signal intensity of the diffraction light beam from the semiconductor wafer 1 is continuously measured so that an X-coordinate of the X-mark 3X is found. The X-coordinate thus detected is then stored in the memory. The X- and Y-marks 3X and 3Y, which function as alignment marks, are detected in this manner.

As heretofore described, the polarized laser beam 10Y used herein vibrates in a plane perpendicular to the diffraction gratings 6 of the Y-mark 3Y (i.e., in the direction Y), thereby suppressing the signal intensity of the diffraction light beam low at a position away from the diffraction gratings 6. Hence, it is possible in this embodiment to accurately detect a coordinate of the Y-mark 3Y which serves as an alignment mark. This is also true of detection of the X-mark 3X. Since the polarized laser beam 10X vibrates in a plane perpendicular to the diffraction gratings 6 forming the X-mark 3X (i.e., in the direction X), a coordinate of the X-mark 3X which serves as an alignment mark is accurately detected.

As to the polarization unit 30 for splitting the laser beam 21 from the He-Ne laser 20 into the predetermined two polarized light beams 10X and 10Y, the structure shown in FIG. 10 is not disclosed in any limiting sense. Polarization units 30A and 30B as shown in FIG. 12 and 13, respectively, may be used instead.

Figure 12:
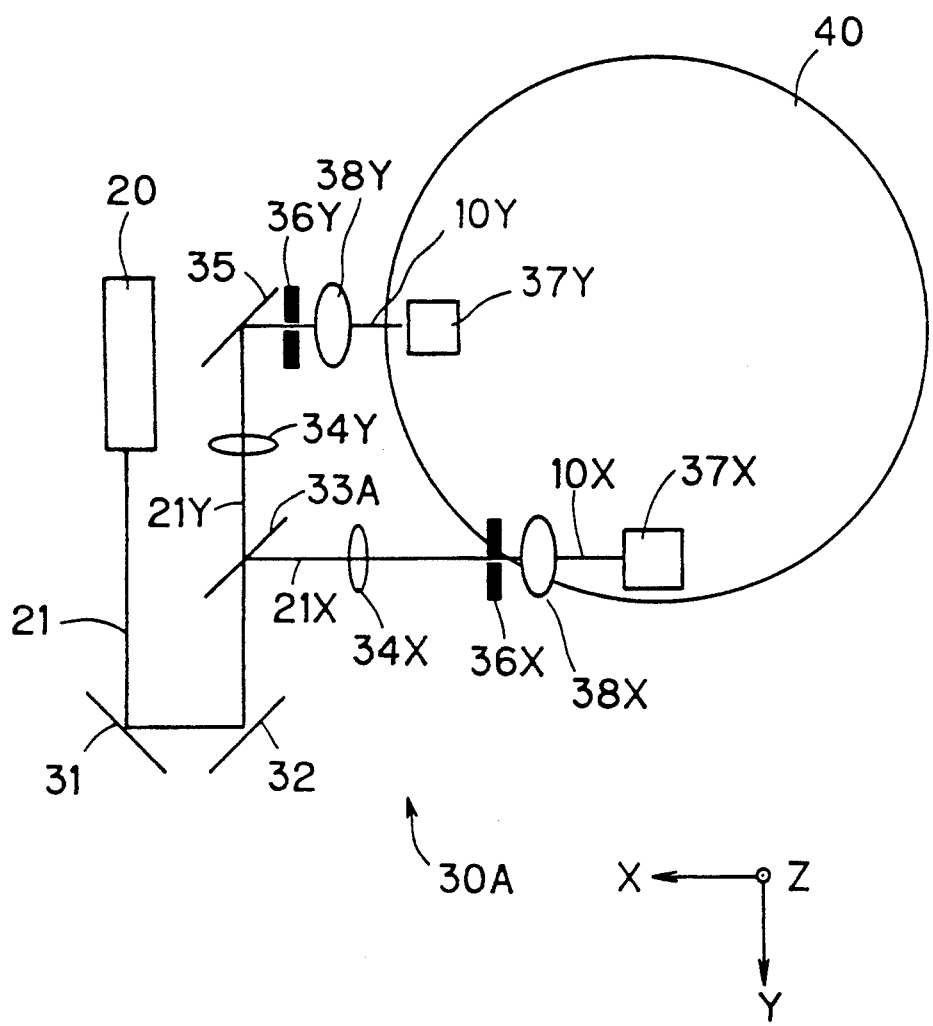
FIG. 12 is a diagram of a polarization unit according to an aspect of the present invention.

The polarization unit 30A of FIG. 12 comprises a half mirror 33A to replace the polarization beam splitter 33. The laser beam 21 is split into two laser beams 21X and 21Y by the half mirror 33A. The laser beam 21X is filtered by a polarizer 38X which is disposed between the beam shaper plate 36X and the half mirror 37X, whereby a polarized laser beam 10X having a predetermined nature is obtained. Likewise the laser beam 21X, the laser beam 21Y is filtered by a polarizer 38Y which is disposed between the beam shaper plate 36Y and the half mirror 37Y so that a polarized laser beam 10Y having a predetermined nature is produced. The polarized laser beams 10X and 10Y thus obtained are used to detect the X- and the Y-marks 3X and 3Y which are formed on the semiconductor wafer 1.

Figure 13:
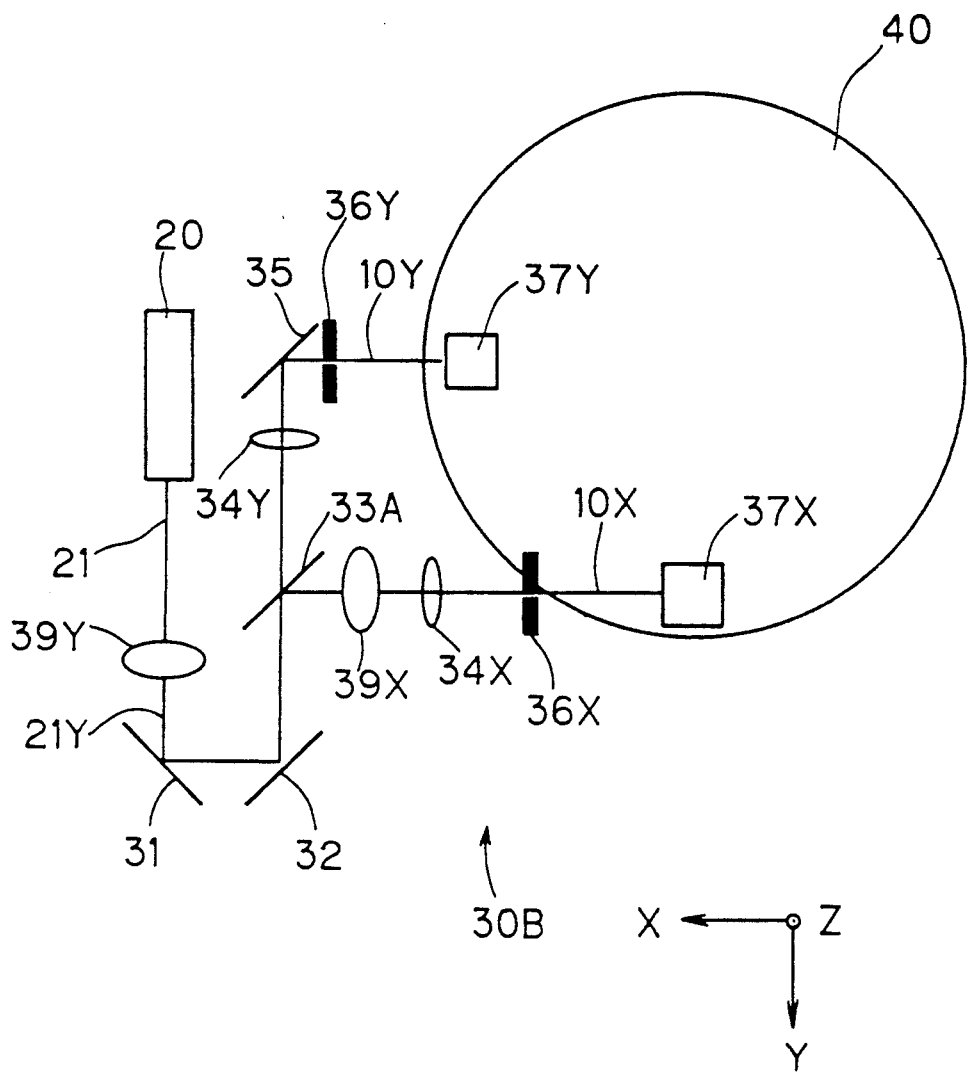
FIG. 13 is a diagram of a polarization unit according to other aspect of the present invention.

The polarization unit 30B of FIG. 13 comprises a polarizer 39Y which is disposed between the He-Ne laser 20 and the mirror 31. Polarized by the polarizer 39Y, the laser beam 21 becomes the laser beam 21Y which consists of polarized components having a nature suitable for detection of the Y-mark 3Y. The polarization beam splitter 33 is replaced with a half mirror 33A which splits the laser beam 21Y into two laser beams, one transmitted by the half mirror 33A and the other reflected by the half mirror 33A. The laser beam transmitted by the half mirror 33A is irradiated onto the semiconductor wafer 1 as the laser beam 10Y which is used to detect the Y-mark. On the other hand, the laser beam reflected by the half mirror 33A enters a polarizer 39X which is disposed between the half mirror 33A and the beam shaper plate 36X. In the polarizer 39X, the laser beam is filtered into the laser beam 10X which consists of polarized components of a nature suitable for detection of the X-mark 3X, and thereafter irradiated as such onto the semiconductor wafer 1.

Figure 14:
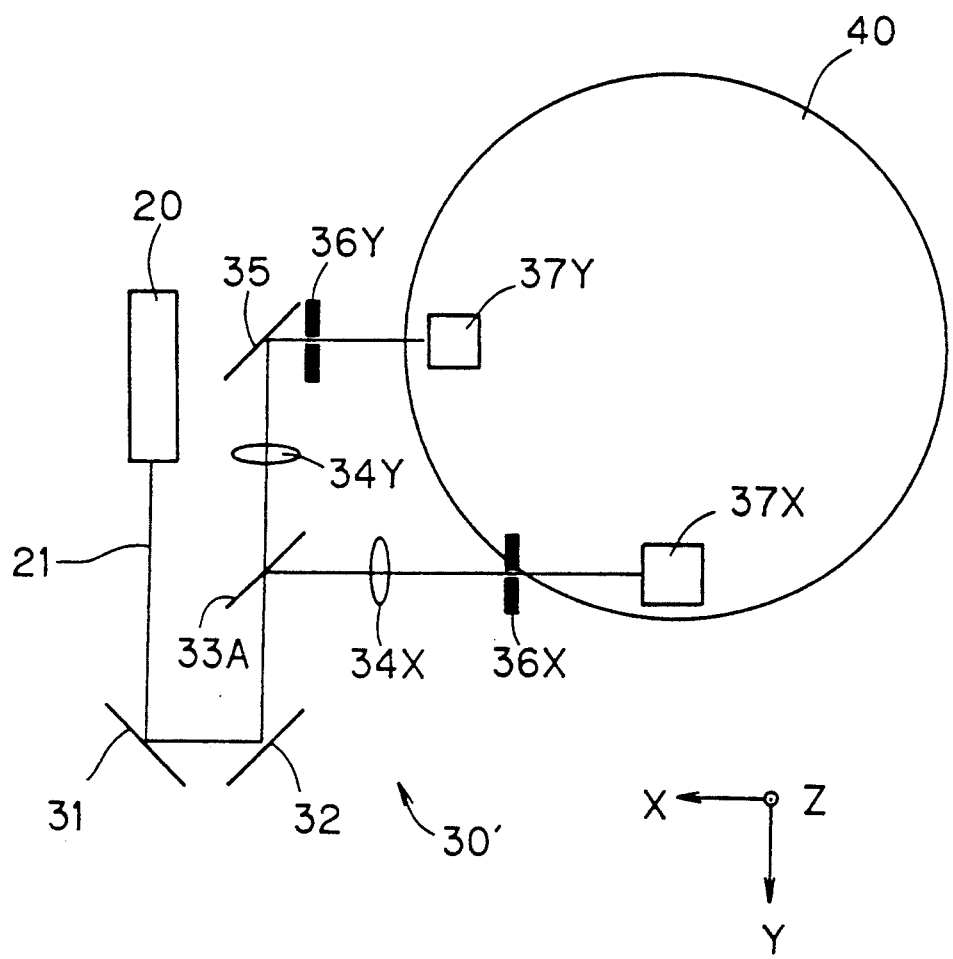
FIG. 14 is a diagram of a polarization unit according to still other aspect of the present invention.
Figure 15:
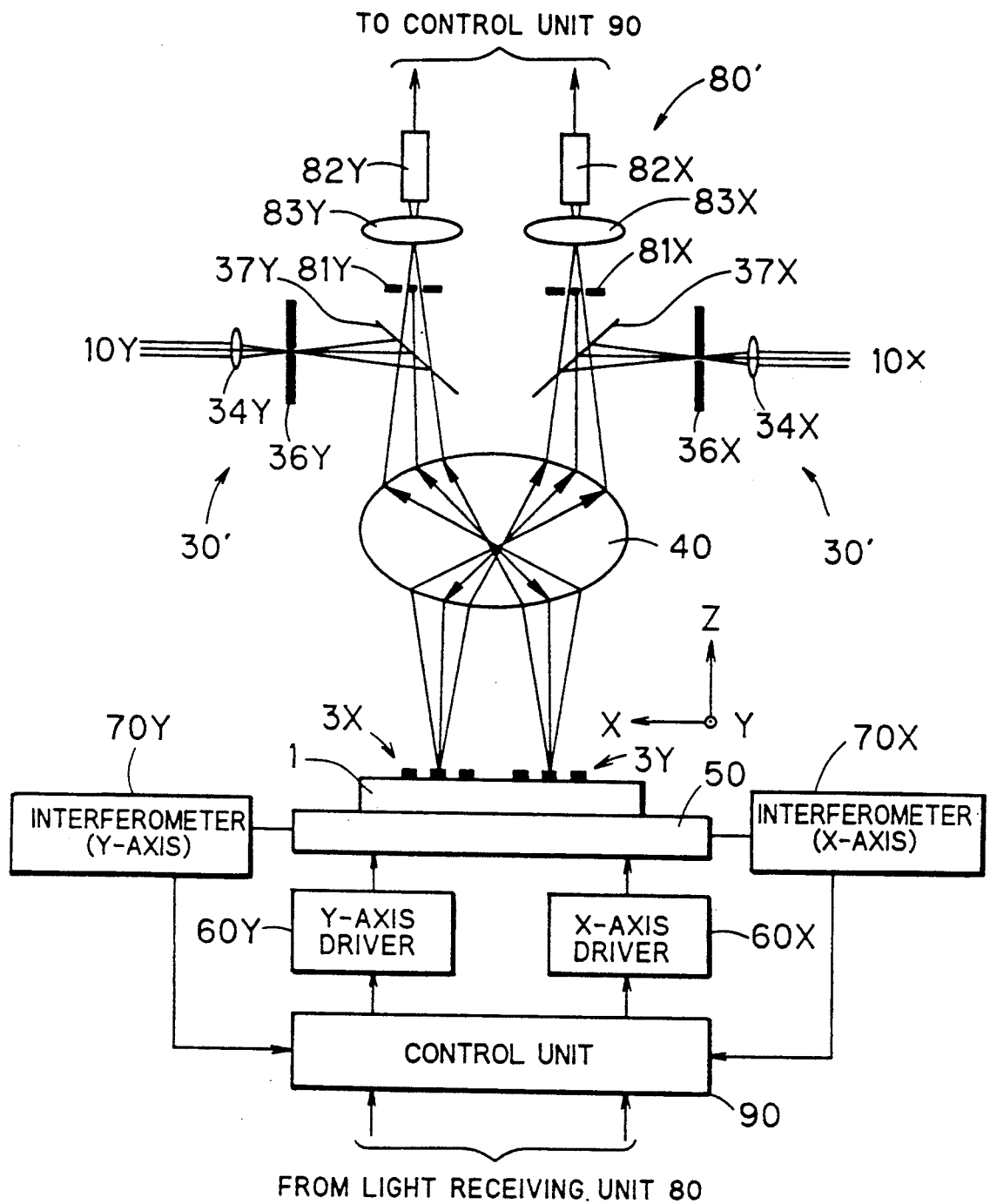
FIGS. 15 and 16 are schematic diagrams showing other embodiments of an apparatus for detecting alignment marks to which the detection method of the present invention is applicable.

FIGS. 14 and 15 are schematic diagrams showing the structure of an apparatus for detecting alignment marks according to another preferred embodiment of the present invention. The detection apparatus of this embodiment largely differs from the detection apparatus of the precedent embodiment (FIGS. 10 and 11) in that a dividing unit 30' is used in stead of the polarization unit 30 in order to split the laser beam 21 from the He-Ne laser 20 into the two laser beams 21X and 21Y (FIG. 14) and that the light receiving unit further includes polarizers 83X and 83Y (FIG. 15). The two detection apparatuses are otherwise similar to each other, and therefore, repetition of a similar description is avoided.

In the dividing unit 30', two mirrors 31 and 32 relay the laser beam 21 from the He-Ne laser 20 to a half mirror S3A by which it is split into the two laser beams 21X and 21Y. Since the half mirror 33A does not have polarization characteristics, the resultant laser beams 21X and 21Y each vibrate in planes at random angles as the laser beam 21 does.

The laser beam 21X impinges on a beam shaper plate 36X through a lens 34X. Having been shaped at the beam shaper plate 36X, the laser beam 21X enters a half mirror 37X through which it is allowed to a projection lens 40. The laser beam 21Y impinges on the projection lens 40 via a similar route.

The laser beams 21X and 21Y passed through the projection lens 40 are illuminated on the semiconductor wafer 1 at predetermined positions (i.e., laser beam illumination positions). Under the illumination of the laser beams 21X and 21Y at the laser beam illumination positions, the X-Y stage 50 mounting the semiconductor wafer 1 is moved in the directions X and Y. While thus sliding the semiconductor wafer 1, the light receiving sensors 82X and 82Y continuously measure the signal intensities of diffraction light beams from the semiconductor wafer 1. The polarizer 83X is disposed in front of the light receiving sensor 82X so that the light receiving sensor 82X receives a polarized laser beam which consists of polarized components vibrating in a plane perpendicular to the array of the diffraction gratings 6 forming the X-mark 3X (i.e., in the direction X). The same consideration is taken regarding the light receiving sensor 82Y. That is, the polarizer 83Y is disposed so as to ensure that the light receiving sensor 82Y receives a polarized laser beam which consists of polarized components vibrating in a plane perpendicular to the array of the diffraction gratings 6 forming the Y-mark 3Y (i.e., in the direction Y).

Hence, if the semiconductor wafer 1 as being irradiated with the laser beams 21X and 21Y is moved in the direction Y in the course of which the signal intensities of resulting diffraction light beams from the semiconductor wafer 1 are measured continuously, the signal intensities regarding the direction Y follow an ideal waveform like what is shown in FIG. 7B. Hence, where the intensity peak as to the Y-mark 3Y occurs is precisely found, which enables accurate detection of the Y-mark 3Y. The X-mark 3X is also accurately detected in a similar manner.

Figure 1:
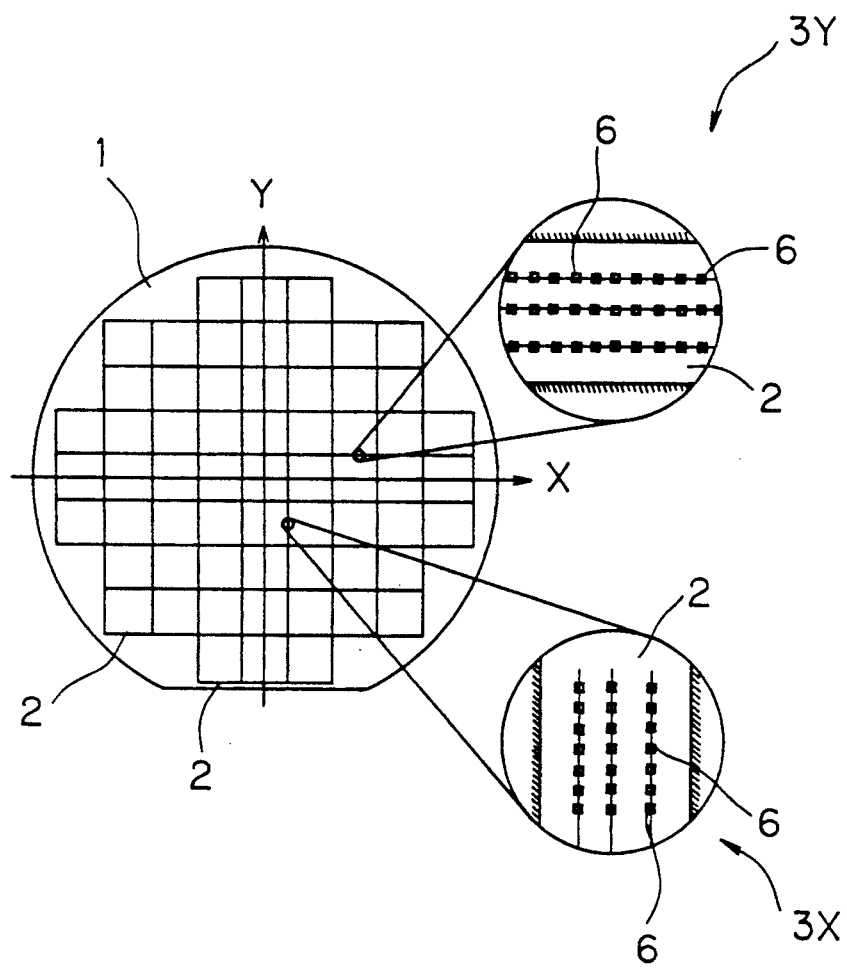
FIG. 1 shows an example of alignment marks.
Figure 2A:
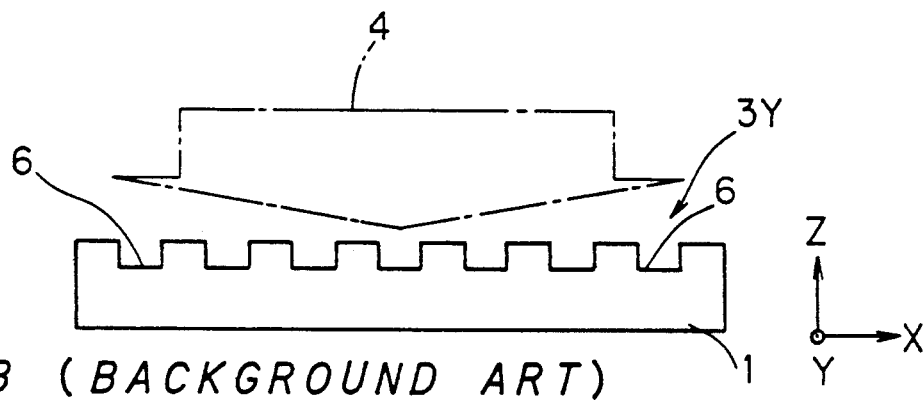
FIGS. 2A and 2B are explanatory diagrams for explaining a conventional method of detecting alignment marks.
Figure 2B:
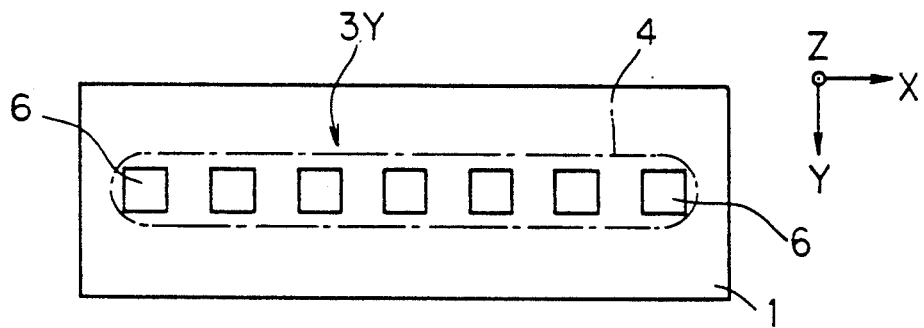
Figure 3:
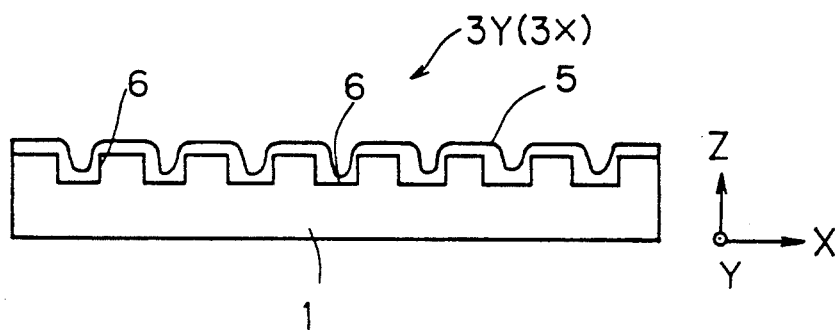
FIG. 3 shows diffraction gratings each having an asymmetric configuration.
Figure 4:
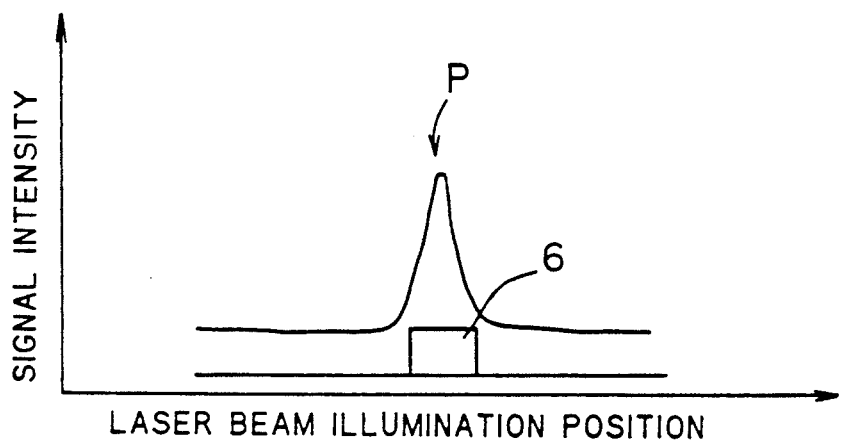
FIG. 4 is a graph plotting the intensity of a diffraction light beam produced by the diffraction gratings of FIGS. 2A and 2B against an illumination position of a laser beam.
Figure 5:
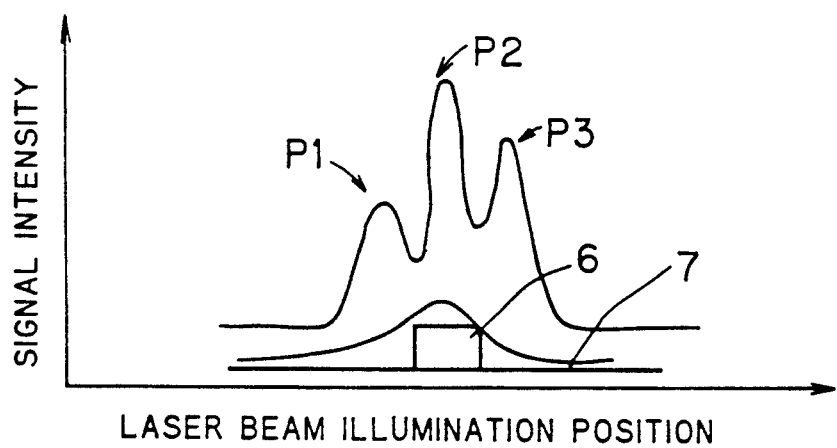
FIG. 5 is a graph plotting the intensity of a diffraction light beam produced by the diffraction gratings of FIG. 3 against an illumination position of a laser beam.

In the detection apparatuses above, a laser beam is polarized regardless of whether the X- and Y-marks 3X and 3Y each have an asymmetric configuration as shown in FIG. 3 or an ideal configuration as shown in FIG. 2A. However, in detecting the X- and Y-marks 3X and 3Y formed by diffraction gratings in ideal configurations, a laser beam needs not to be polarized. Conversely, to polarize a laser beam could backfire; more precisely, the signal intensity of a diffraction light beam could become weak, thereby inviting deterioration in the S/N ratio and hence in a detection accuracy of the detection apparatus. To deal with this, it is desirable that the detection apparatuses heretofore described are each equipped with a selector (FIG. 16) which switches the detection apparatuses from polarization mode to regular mode and vice versa depending on the configurations of the diffraction gratings.

Figure 16:
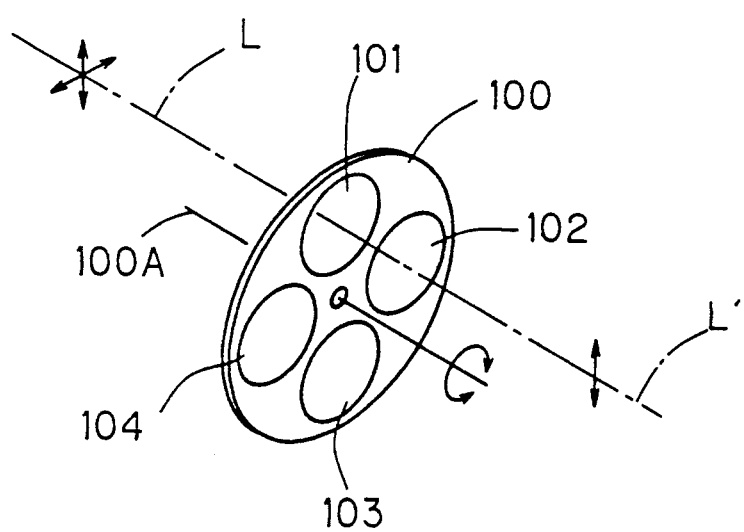

FIG. 16 is a perspective view of a polarization selector which is used in the detection apparatuses of the present invention in order to selectively enter the detection apparatuses into the polarization mode and the regular mode. The polarization selector comprises polarizers 101 to 103 which are mounted to a plate 100 which is rotatable about a rotation axis 100A. What is indicated at 104 in FIG. 16 is an opening.

In FIG. 16, the plate 100 is set so as to place the polarizer 101 on the optical path of a laser beam L. The laser beam L which vibrates in planes at random angles enters the polarizer 101 where it is filtered into a polarized laser beam L' which vibrates in a predetermined plane. On the other hand, if the opening 104 is placed on the optical path of the laser beam L, the laser beam L' will remains the same as the laser beam L in that it vibrates in planes at random angles. Thus, the laser beam L is polarized or is not polarized depending on where the plate 100 is set. Hence, if the X- and Y-marks 3X and 3Y are formed by diffraction gratings in ideal configurations (FIG. 2A), the opening 104 is set on the optical path of the laser beam L so that a resultant laser beam which vibrates in planes at random angles is irradiated on the X- and Y-marks 3X and 3Y to be detected. If the X- and Y-marks 3X and 3Y are formed by diffraction gratings having asymmetric configurations (FIG. 3), the polarizer 101, 102 or 103 is placed on the optical path of the laser beam L so that a resulting polarized laser beam which vibrates in a predetermined plane is illuminated on the X- and Y-marks 3X and 3Y to be detected.

While the invention has been shown and described in detail, the foregoing description is in all aspects illustrative and not restrictive. It is understood that numerous modifications and variations can be devised without departing from the scope of the invention.

What is claimed is:

1. A method of detecting an alignment mark of a semiconductor wafer by measuring the light intensity of a diffractive light beam from a diffractive grating array which is formed on said semiconductor wafer and which extends in a first direction, said method comprising the steps of:
   (a) irradiating said semiconductor wafer with a polarized light beam while relatively moving said semiconductor wafer and said polarized light beam, said polarized light beam consisting of a polarized component which vibrates in a second direction substantially perpendicular to the first direction;
   (b) receiving a diffractive light beam from said semiconductor wafer; and
   (c) detecting said diffractive grating array on the basis of said light intensity of the received diffractive light beam.

2. The method of claim 1, wherein said polarized light beam acts On said diffractive grating array as a P-polarized light beam.

3. A method of detecting an alignment mark of a semiconductor wafer by measuring the light intensity of a light beam from a diffractive grating array which is formed on said semiconductor wafer and which extends in a first direction, said method comprising the steps of:
   (a) irradiating said semiconductor wafer with a non-polarized light beam while relatively moving said semiconductor wafer and said non-polarized light beam, said non-polarized light beam vibrating in planes at random angles;
   (b) polarizing a diffractive light beam from said semiconductor wafer, thereby obtaining a polarized light beam, said polarized light beam consisting of a polarized component which vibrates in a second direction substantially perpendicular to the first direction;
   (c) receiving said polarized light beam; and
   (d) detecting said diffractive grating array on the basis of said light intensity of the received polarized light beam.

4. The method of claim 3, wherein said polarized light beam acts on said diffractive grating array as a P-polarized light beam.

5. A apparatus for detecting an alignment mark of a semiconductor wafer by measuring the light intensity of a light beam from a diffractive grating array which is formed on said semiconductor wafer and which extends in a first direction, said apparatus comprising:
   (a) means for obtaining a polarized light beam, said polarized light beam having a polarized component which vibrates in a second direction substantially perpendicular to the first direction;
   (b) a stage for holding said semiconductor wafer;
   (c) means for directing said polarized light beam to said semiconductor wafer mounted on said stage;
   (d) light receiving means for receiving a diffractive light beam from said semiconductor wafer; and
   (e) means for relatively moving said semiconductor wafer and said polarized light beam while detecting said diffractive grating array on the basis of said light intensity of the diffractive light beam received by said light receiving means.

6. The apparatus of claim 5, wherein said means (a) comprises:
   (a-1) a light source for emitting a non-polarized light beam, said non-polarized light beam vibrating in planes at random angles; and
   (a-2) a polarization beam splitter for splitting said non-polarized light beam into two polarized light beams, one of said polarized light beams consisting of the polarized component which vibrates in the second direction.

7. The apparatus of claim 5, wherein said means (a) comprises:
   (a-1) a light source for emitting a non-polarized light beam, said non-polarized light beam vibrating in planes at random angles; and
   (a-2) a polarizer for polarizing said non-polarized light beam, thereby obtaining said polarized light beam.

8. The apparatus of claim 7, wherein said means (a) further comprises:
   (a-3) means for passing said non-polarized light beam from said light source without polarization., and
   (a-4) means for interchanging said polarizer and said means (a-3).

9. The apparatus of claim 5, wherein said means (c) comprises:
   (c-1) a projection optical system for irradiating said polarized light beam onto said semiconductor wafer.

10. A apparatus for detecting an alignment mark of a semiconductor wafer by measuring the light intensity of a light beam from a diffractive grating array which is formed on said semiconductor wafer and which extends in a first direction, said apparatus comprising:
    (a) a light source for emitting a non-polarized light beam, said non-polarized light beam vibrating in planes at random angles;
    (b) a stage for holding said semiconductor wafer;
    (c) means for directing said non-polarized light beam to said semiconductor wafer mounted on said stage;
    (d) a polarizer for polarizing a diffractive light beam from said semiconductor wafer, thereby obtaining a polarized light beam, said polarized light beam consisting of a polarized component which vibrates in a second direction substantially perpendicular to the first direction;
    (e) light receiving means for receiving said polarized light beam passing through said polarizer; and
    (f) means for relatively moving said semiconductor wafer and said polarized light beam while detecting said diffractive grating array on the basis of said light intensity of said polarized light beam received by said light receiving means.

11. The apparatus of claim 10, further comprising:
    (g) means for passing said diffractive light beam from said semiconductor wafer without polarization; and
    (h) means for interchanging said polarizer and said means (g).

* * * * *